United States Patent
Colburn et al.

(10) Patent No.: US 7,435,074 B2
(45) Date of Patent: Oct. 14, 2008

(54) METHOD FOR FABRICATING DUAL DAMASCENCE STRUCTURES USING PHOTO-IMPRINT LITHOGRAPHY, METHODS FOR FABRICATING IMPRINT LITHOGRAPHY MOLDS FOR DUAL DAMASCENE STRUCTURES, MATERIALS FOR IMPRINTABLE DIELECTRICS AND EQUIPMENT FOR PHOTO-IMPRINT LITHOGRAPHY USED IN DUAL DAMASCENCE PATTERNING

(75) Inventors: Matthew E. Colburn, Hopewell Junction, NY (US); Kenneth Raymond Carter, San Jose, CA (US); Gary M. McClelland, Palo Alto, CA (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 659 days.

(21) Appl. No.: 10/799,282

(22) Filed: Mar. 13, 2004

(65) Prior Publication Data

US 2005/0202350 A1    Sep. 15, 2005

(51) Int. Cl.
*C29C 59/02*    (2006.01)
*C03C 17/22*    (2006.01)

(52) U.S. Cl. .................. 425/385; 425/810; 425/470; 425/472; 216/72

(58) Field of Classification Search ................ 425/308, 425/412, 812, 385, 810, 470, 403, 472; 249/114.1–115; 216/72, 44, 47, 49, 54, 73; 438/740–741, 438/700–703, 734–737; 430/5, 313; 264/220, 264/241, 447, 480
See application file for complete search history.

(56) References Cited

U.S. PATENT DOCUMENTS

| | | | |
|---|---|---|---|
| 5,204,126 A * | 4/1993 | Singh et al. ............... 425/412 |
| 6,429,932 B1 * | 8/2002 | Hatami-Hanza .......... 356/239.2 |
| 6,517,995 B1 * | 2/2003 | Jacobson et al. ............ 430/320 |
| 6,607,173 B2 * | 8/2003 | Westmoreland .......... 249/114.1 |
| 6,632,342 B1 * | 10/2003 | Teshima et al. ............. 205/118 |
| 6,656,393 B2 * | 12/2003 | Yagi et al. .................... 264/2.5 |
| 6,713,238 B1 * | 3/2004 | Chou et al. .................. 430/322 |
| 6,921,630 B2 * | 7/2005 | Dentinger ................... 430/322 |
| 6,936,181 B2 * | 8/2005 | Bulthaup et al. .............. 216/44 |
| 6,949,199 B1 * | 9/2005 | Gauzner et al. ................ 216/2 |
| 7,013,064 B2 * | 3/2006 | Wang ........................... 385/37 |
| 7,070,405 B2 * | 7/2006 | Sreenivasan et al. ..... 425/174.4 |
| 7,077,992 B2 * | 7/2006 | Sreenivasan et al. ........ 264/496 |
| 7,136,150 B2 * | 11/2006 | Sreenivasan et al. .......... 355/75 |
| 7,235,474 B1 * | 6/2007 | Dakshina-Murthy et al. .......................... 438/597 |
| 2002/0185584 A1 * | 12/2002 | Westmoreland .......... 249/114.1 |
| 2003/0080458 A1 * | 5/2003 | Heilig et al. ................ 264/130 |
| 2003/0209819 A1 * | 11/2003 | Brown et al. ................. 264/2.5 |
| 2004/0029041 A1 * | 2/2004 | Shih et al. ................ 430/271.1 |
| 2004/0036201 A1 * | 2/2004 | Chou et al. .................. 264/402 |
| 2004/0039090 A1 * | 2/2004 | Seidel et al. ................ 524/115 |
| 2004/0131718 A1 * | 7/2004 | Chou et al. .................. 425/385 |
| 2004/0146792 A1 * | 7/2004 | Nimmakayala et al. ....... 430/22 |

(Continued)

*Primary Examiner*—Steven P. Griffin
*Assistant Examiner*—Seyed Masoud Malekzadeh
(74) *Attorney, Agent, or Firm*—Thomas A. Beck; Daniel P. Morris

(57) ABSTRACT

The process of producing a dual damascene structure used for the interconnect architecture of semiconductor chips. More specifically the use of imprint lithography to fabricate dual damascene structures in a dielectric and the fabrication of dual damascene structured molds.

10 Claims, 13 Drawing Sheets

U.S. PATENT DOCUMENTS

| | | |
|---|---|---|
| 2004/0169861 A1* | 9/2004 | Mieher et al. ............... 356/400 |
| 2004/0233442 A1* | 11/2004 | Mieher et al. ............... 356/401 |
| 2004/0233443 A1* | 11/2004 | Mieher et al. ............... 356/401 |
| 2004/0233444 A1* | 11/2004 | Mieher et al. ............... 356/401 |
| 2004/0259279 A1* | 12/2004 | Erchak et al. ................. 438/22 |
| 2005/0067379 A1* | 3/2005 | Sreenivasan et al. .......... 216/44 |
| 2005/0133954 A1* | 6/2005 | Homola ...................... 264/219 |
| 2005/0179149 A1* | 8/2005 | Stapert et al. .............. 264/1.32 |
| 2006/0183060 A1* | 8/2006 | Perret et al. ................. 430/323 |

* cited by examiner

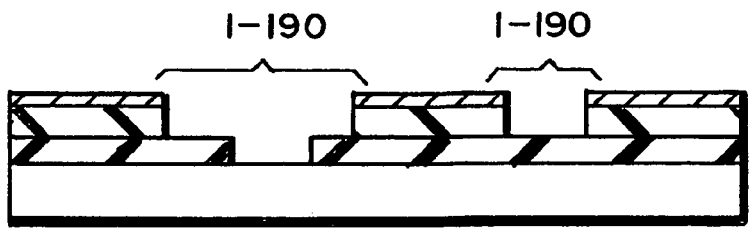
FIG.1e
PRIOR ART
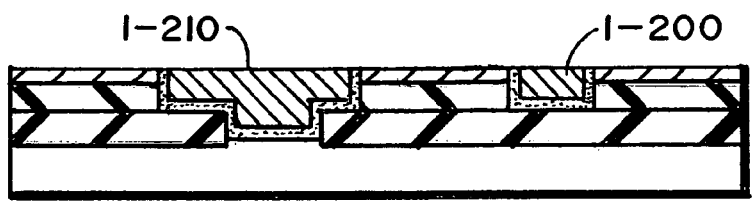
FIG.1f
PRIOR ART
FIG.1g PRIOR ART
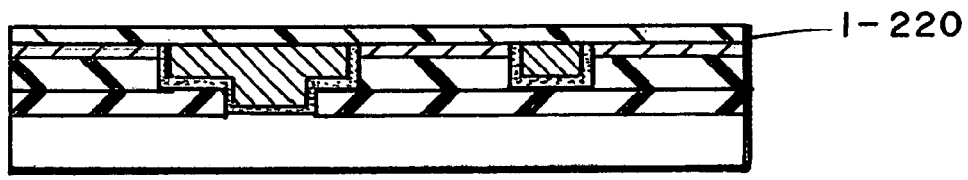
FIG.2a
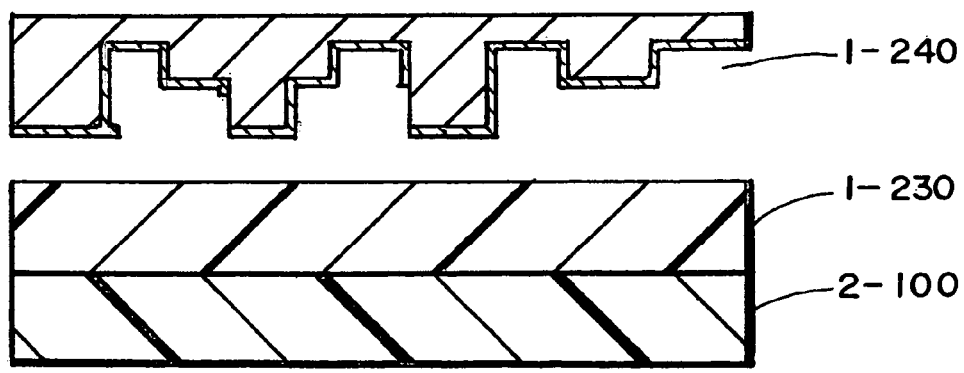

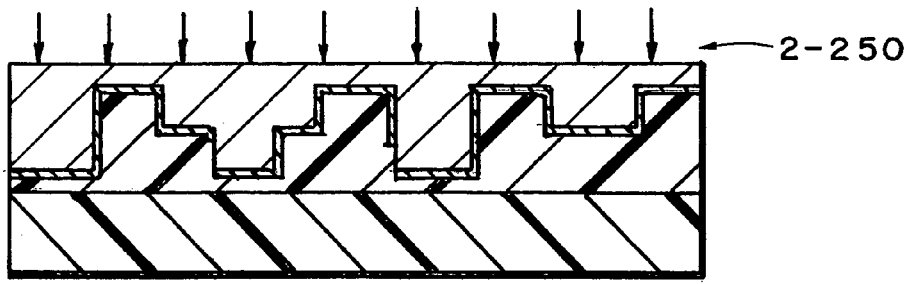
FIG.2b
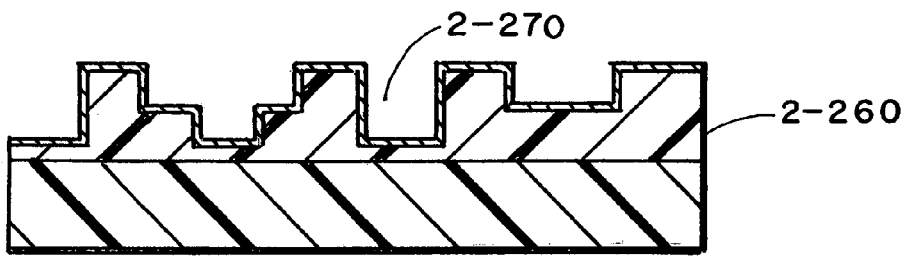
FIG.2c
FIG.2d
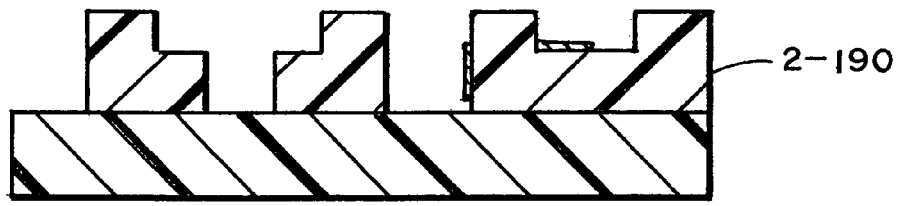
FIG.3a
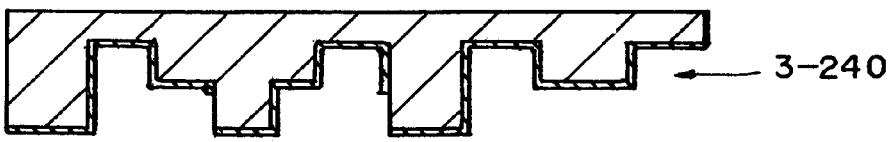
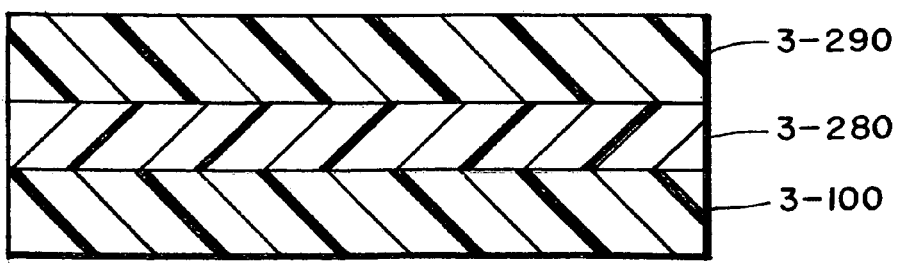

METHOD FOR FABRICATING DUAL DAMASCENCE STRUCTURES USING PHOTO-IMPRINT LITHOGRAPHY, METHODS FOR FABRICATING IMPRINT LITHOGRAPHY MOLDS FOR DUAL DAMASCENE STRUCTURES, MATERIALS FOR IMPRINTABLE DIELECTRICS AND EQUIPMENT FOR PHOTO-IMPRINT LITHOGRAPHY USED IN DUAL DAMASCENCE PATTERNING

BACKGROUND OF THE INVENTION

1. Field of the Invention

The present invention pertains to the process of producing a dual damascene structure used for the interconnect architecture of semiconductor chips. More specifically this invention addresses the novel use of imprint lithography for fabricating dual damascene structures in a dielectric and the novel fabrication of dual damascene structured molds for improved manufacturing throughput, process simplification, and cost reduction, and equipment to implement dual damascene imprint lithographic methods.

2. Description of Related Art

The conventional lithographic process involves the projection of a pattern from a mask onto a substrate wherein tha mask comprises a set or series of patterns consisting of opaque and transpartent regions. The substrate contains a photosensitive polymer thereon. There are two types of photoresists: positive and negative which are explained in greater detail below.

The fabrication of Very-Large Scale Integrated (VLSI) or Ultra-Large Scale Integrated circuit (ULSI) requires metallic wiring that connects individual devices in a semiconductor chip, to one another. The resultant product of one method of creating this wiring network on a small scale is the dual damascene (DD) process schematically shown in FIG. 1. An alternative depiction of this type product is disclosed in Deal, M; et al.; *Silicon VLSI Technology: Fundamentals, Practice, and Modeling*, Prentice, Upper Saddle River N.J. (2000) p. 724.

In FIG. 1a, depicting a cross section of a product of the standard DD1 process, an interlayer dielectric (ILD), shown as two layers PA1-110, PA1-120 is coated on the substrate PA1-100, FIG. 1a. The via level dielectric PA1-110 and the line level dielectric PA1-120 are shown separately for clarity of the process flow description. In general, these two layers can be made of the same or different insulating films, and in the former case, can be applied as a single monolithic layer. A hard mask layer(s) PA1-130 is optionally employed to facilitate etch selectivity and to serve as a polish stop as will be discussed later.

The wiring interconnect network consists of two types of features: line features that traverse a distance across the chip in a horizontal plane, and the via features which connect lines in different levels together in a vertical plane. Historically, both layers are made from an inorganic glass-like silicon dioxide ($SiO_2$) or a fluorinated silica film deposited by plasma enhanced chemical vapor deposition (PECVD).

In the conventional dual damascene process, the position of the horizontal lines PA1-150 and the vertical vias PA1-170 are defined lithographically in photoresist layers, PA1-140, depicted in FIGS. 1b and 1d respectively, and transferred into the hard mask and ILD layers using reactive ion etching processes.

The results of the process sequence shown in FIG. 1c is called a "line-first" approach because the trench PA1-160 which will house the line feature is etched first. After the trench formation, lithography is used to define a via pattern PA1-170 in the photoresist layer PA1-140, which is transferred into the dielectric material to generate a via opening PA1-180, FIG. 1d. The dual damascene trench and via structure PA1-190 is shown in FIG. 1e after the photoresist has been stripped. This structure PA1-190 is coated with a conducting liner material or material stack PA1-200 that serves to protect the conductor metal lines and vias and serve as an adhesion layer between the conductor and the ILD. This recess is then filled with a conducting fill material PA1-210 over the surface of the patterned substrate. The fill is most commonly accomplished by electroplating of copper, although other methods such as CVD and other materials such as Al or Au can also be used. The fill and liner materials are then chemically-mechanically polished (CMP) to be coplanar with the surface of the hard mask and the structure at this stage is shown in FIG. 1f.

A capping material PA1-220 is deposited over the metal or as a blanket film, as is depicted in FIG. 1g to passivate the exposed metal surface and to serve as a diffusion barrier between the metal and any additional ILD layers to be deposited over them. Silicon nitride, silicon carbide, and silicon carbonitride films deposited by PECVD are typically used as the capping material PA1-220. This process sequence is repeated for each level of the interconnects on the device. Since two interconnect features are defined to form a conductor in-lay within an insulator by a single polish step, this process is designated a dual damascene process.

Printed publications which provide a background for the present invention and which are hereby incorporated by reference and made a part of this disclosure are: U.S. Pat. No. 6,696,224, Template for Room Temperature, Low Pressure Micro- and Nano-Print Lithography; U.S. Pat. No. 6,334,960, Step and Flash Imprint Lithography; U.S. Publication Application Number 20020098426; High-Resolution Overlay Alignment Methods and Systems for Imprint Lithography; U.S. Publication Application Number 20020094496 Method and System of Automatic Fluid Dispensing for Imprint Lithography; U.S. Publication Application Number 20020093122, Methods for High Precision Gap and Orientation Sensing Between a Transparent Template and Substrate for Imprint Lithography; U.S. Publication Application Number 20040022888, Alignment Systems for Imprint Lithography; U.S. Publication Application Number 20040021254, Alignment Methods for Imprint Lithography; U.S. Publication Application Number 20040009673, Method and System for Imprint Lithography Using an Electric Field; U.S. Publication Application Number 20040008334, Step and Repeat Imprint Lithography Systems, U.S. Publication Application Number 20040007799, Formation of Discontinuous Films During an Imprint Lithography Process; U.S. Publication Application Number 20020115002, Template for Room Temperature, Low Pressure Micro- and Nanao-imprint Lithography; U.S. Publication Application Number 20020098426, High Resolution Overlay Alignment Methods and Systems for Imprint Lithography; U.S. Publication Application Number 20020094496, Method and System of Automatic Fluid Dispensing for Imprint Lithography Processes, U.S. Publication Application Number 20020093122, Methods for High-Precision Gap and Orientation Sensing Between a Transparent Template and Substrate for Imprint Lithography.

SUMMARY OF THE INVENTION

The present invention pertains: (a) to the fabrication of dual damascene structures using imprint lithographic techniques; (b) to the fabrication of dual damascene relief structures in imprint lithography molds; (c) to the design of equipment for imprinting dual damascene structures; (d) and to the formulation of material for dual damascene imprint lithography.

While the description of the present invention is predominately discussed herein in terms of "photolithography," it is to be understood that where that term is used in the discussion of the invention, it shall include and be equally applicable to systems that use heat and pressure as well as light or any combination of these systems.

The method of the present invention includes (a) a means, such as a mask, for fabricating a dual damascene structure in a reactive ion-etch-resistant material which is used to transfer its pattern into a interlayer dielectric, (b) a means for fabricating a dual damascene structure in a material suitable for an interlayer dielectric, (c) a means for fabricating a dual damascene structure in a material which is converted into an interlayer dielectric through a thermal anneal, (d) a means for fabricating a dual damascene structure in a material which is converted into an interlayer dielectric through a chemical treatment, (e) a means for fabricating a dual damascene structure in a material which is converted into an interlayer dielectric through a combination of a thermal anneal process and chemical treatment process, (f) imprintable material formulations that render an etch-resistant material when imprinted, (g) formulations that render an interlayer dielectric material, (h) formulations that render a dual damascene structure, but require subsequent thermal, plasma, and/or chemical treatment to generate an interlayer dielectric material, (i) chemical treatment of an imprinted material that includes wet-chemical, vapor, or plasma treatment, (j) additives to imprintable solutions that increase the adhesive strength of the imprint material—substrate interface such as multifunctional coupling agents, (k) additives to imprintable solutions that decrease the adhesive strength of the imprint material—mold interface, (l) a means of fabricating a multilevel mold that contains a dual damascene relief structure, (m) imprinting dual damascene structures with imprint equipment that contain flexures for X, Y, or Z positioning, and/or $\alpha$, $\beta$, or $\gamma$ tilting, (n) imprinting dual damascene structures with imprint equipment that contain Z-gap control, (O) imprinting dual damascene structures with imprint equipment that allows for layer-to-layer overlay, (p) imprint dual damascene structures with equipment that uses pattern recognition for overlay, (q) incorporating overlay and/or alignment structures into a dual damascene mold, (r) imprinting materials in a dual damascene structure that remain in the substrate, (s) performing a reactive ion etch that removes residual imprinted material allowing for electrical contact between the line level metal in a dual damascene structures and the underlying conductive pattern, (t) coating a dual damascene mold structure with a low surface energy film including fluorinated self-assembly monolayers, (u) utilizing gap sensing equipment to recognize position of the dual damascene mold's closest surface, (v) utilizing a microdroplet pattern to optimize uniformity of dual damascene imprint, (w) utilizing a spin coated imprint resin solution that allows a dual damascene imprint.

More specifically, one method for producing a multilevel mold that contains the relief image of a dual-damascene structure or the negative relief image of a dual-damascene structure in accordance with the present invention comprises the steps of: coating a substrate with a resist material, said resist material having a top surface; patterning the resist material with a negative line level pattern; etching said negative line level pattern into said substrate to form a negative via level topography transferred in an upper surface of said substrate; coating said upper surface of said substrate with a planarizing layer; coating said planarizing layer with a resist and patterning said resist coating with a negative line level pattern; removing said layers resulting in a shaped article having a negative dual damascene relief topography.

Another method for producing a multilevel mold that contains the relief image of a dual-damascene structure or the negative relief image of a dual-damascene structure comprises the steps of: coating a substrate with a hardmask stack having a plurality of layers, the aforementioned plurality of layers includes a bottom etchstop layer which is in contact with a surface of said substrate; a middle layer suitable for printing a negative line-level pattern, said middle layer being in contact with an exposed surface of said bottom layer; and a top layer suitable for printing a negative line level pattern, said top layer being in contact with an exposed surface of said middle layer; then coating an exposed surface of said top layer of said hardmask stack with a resist; said resist material having a top surface; generating a negative via-level pattern in said top surface of said resist material; transferring said negative via-level pattern into said top layer of said hardmask stack and into said substrate thereby forming a negative line-level pattern transferring said negative line-level pattern and said negative via level pattern through said middle and bottom layers to form a relief of a dual damascene structure; removing the hardmask layers resulting in a negative dual damascene relief structure and patterning said resist material with a negative line level pattern; etching said negative line level pattern into said substrate to form a negative via level topography transferred in an upper surface of said substrate; coating said upper surface of said substrate with a planarizing layer; coating said planarizing layer with a resist and patterning said resist coating with a negative line level pattern; removing said layers resulting in a shaped article having a negative dual damascene relief topography.

In order to form the structure of the present invention, a combination of elements is used which together, acting in cooperation, provide the novel article described herein. The system includes the following elements:
  a. A substrate handling system
  b. A substrate stage
  c. A mold stage
  d. An irradiation system
  e. A mold-substrate orientation control system
  f. A mold fixture
  g. A substrate fixture
  h. A curable material dispensing system
  i. A nitrogen purge system.

BRIEF DESCRIPTION OF THE DRAWINGS

The present invention will be more fully understood by reference to the following detailed description of the preferred embodiments of the present invention when read in conjunction with the accompanying drawings, in which like reference characters refer to like parts throughout the views and in which.

DETAILED DESCRIPTION OF THE PREFERRD EMBODIMENTS

In the following description, reference is made to the accompanying drawings which form a part hereof and which illustrate several embodiments of the present invention. It is understood that other embodiments may be utilized and structural and operational changes may be made without departing from the scope of the present invention.

As discussed above, current methods of manufacturing a dual damascene structure require a multitude of lithography, reactive ion etch, and deposition steps as shown in FIG. 1 in order to generate a Dual Damascene structure. Typically two lithography steps are required. For each lithography step, there may be several reactive ion etch steps required to open the antireflective coating, hardmask stack(s), and the dielectric material itself. The present invention is an improvement of the procedures found in the prior art.

In the first embodiment, shown in FIG. 2a, an imprint lithography mold, 2-240, is brought into proximity of a "substrate stack" comprising a coating of a photo-cureable dielectric material 2-230 atop a substrate, 2-100, said stack being aligned to an underlying pattern (not shown). Mold 2-240 is brought into contact with the substrate stack (comprising 2-100 and 2-230), and the combination is exposed to actinic light, pressure, and/or heat, 2-250, FIG. 2b to cure the photocureable interlayer dielectric material, 2-230.

Once the photo-cureable interlayer dielectric material is cured, the mold is removed leaving behind the relief structure, 2-260, of the mold (See the configuration of 2-240 of FIG. 2a) which has been designed to be the appropriate dual damascene structure. A small amount of cured residual material, 2-270, remains, FIG. 2c. Cured residual material 2-270 must be removed for line-via-line metallic contact to be made. This is removed during a short reactive ion etch to leave the final dual damascene structure as shown in FIG. 2d.

Figure 2E:
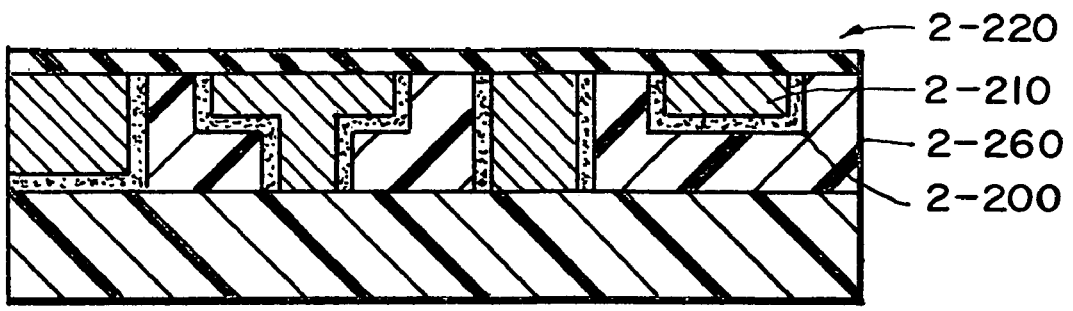
FIG. 2 depicts cross sectional views of Articles formed from the Dual Damascene Fabrication Process of the present invention using Photoimprint Lithography to Define a Pattern in a Photo-sensitive Layer that meets the requirements of an Interlayer Dielectric.

The final dual damascene structure, 2-190, in the photocured interlayer dielectric as shown in FIG. 2d is then coated with liner, 2-200, and metalized, 2-210. As shown in FIG. 2e, liner 2-200 and metal 2-210 are polished to the surface of interlayer dielectric 2-260. Then a cap layer, 2-220, is put down selectively or, as shown in FIG. 2e, is put down in a blanket film. This structure is then ready for another level build which repeats the steps detailed above.

In second preferred embodiment, shown in FIG. 3, an imprint lithography mold, 3-240, is brought into proximity of a "substrate stack" comprising a coating of an interlayer dielectric material 3-280 and a photo-curable material, 3-290 atop a substrate, 3-100, said stack being aligned to an underlying pattern (not shown). The mold is brought into contact with the substrate stack comprising 3-100, 3-280, 3-290, which is exposed to actinic light, pressure, and/or heat, 3-250, as depicted in FIG. 3b.

Figure 1A:
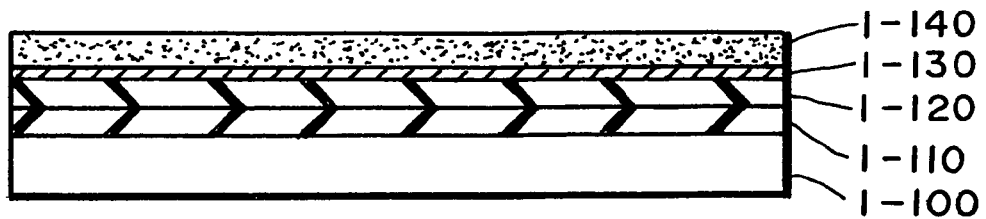
FIG. 1 depicts a Dual Damascene Process as found in the Prior Art.
Figure 1B:
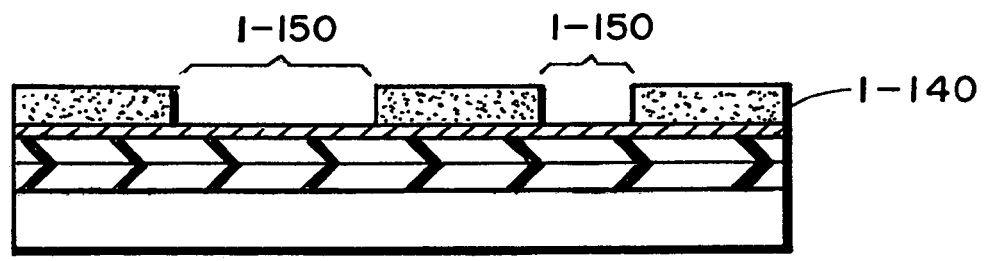
Figure 1C:
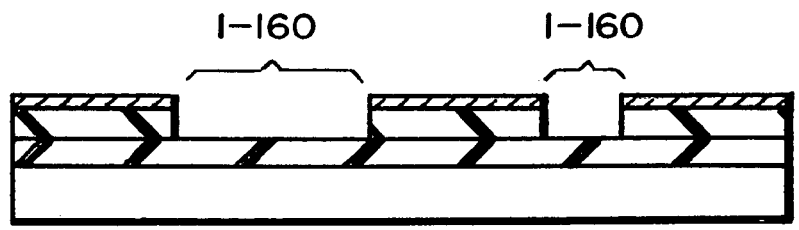
Figure 1D:
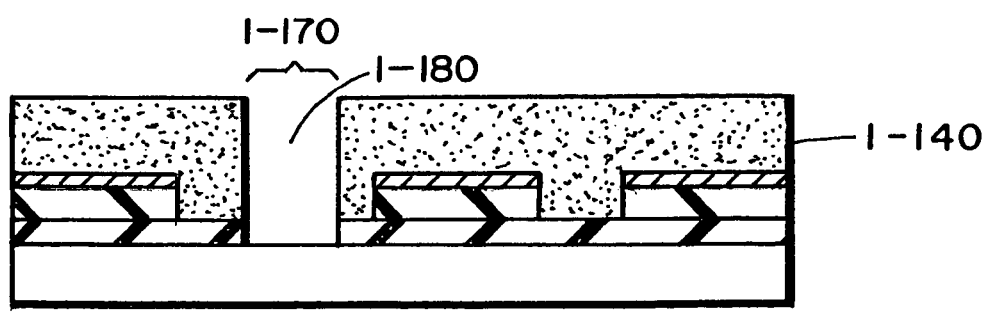
Figure 3B:
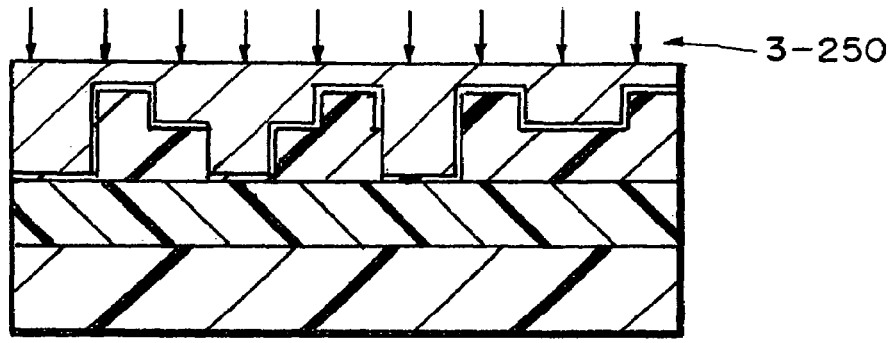
FIG. 3 depicts alternate cross sectional views of Articles formed from the Dual Damascene Fabrication Process of the present invention using Photoimprint Lithography to Define a Pattern in a Photo-curable material and subsequently transferred into an Interlayer Dielectric Layer.
Figure 3C:
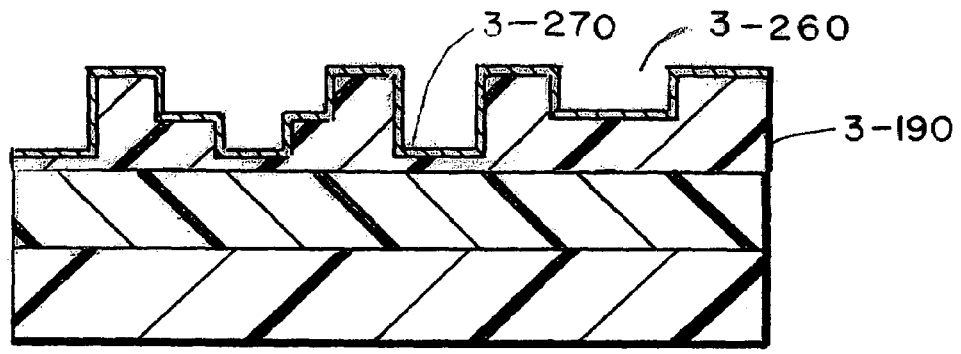
Figure 3D:
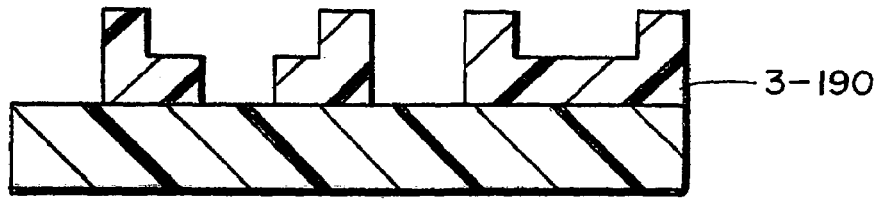

Once the photocureable material is cured, the mold is removed, as shown in FIG. 3c, leaving behind the relief structure, 3-260, of the mold (See the configuration of 3-240 of FIG. 3a) which has been designed to be the appropriate dual damascene structure. A small amount of cured residual material, 3-270, remains. The dual structure in the photocured imprint resin is then used as a reactive ion etch mask during the interlayer dielectric etch to produce the dual damascene structure, 3-190, shown in FIG. 3d. The imprint resin is used to generate a multilayer resist-based hardmask to transfer each of the two layers (line and via) into the interlayer dielectric.

Figure 3E:
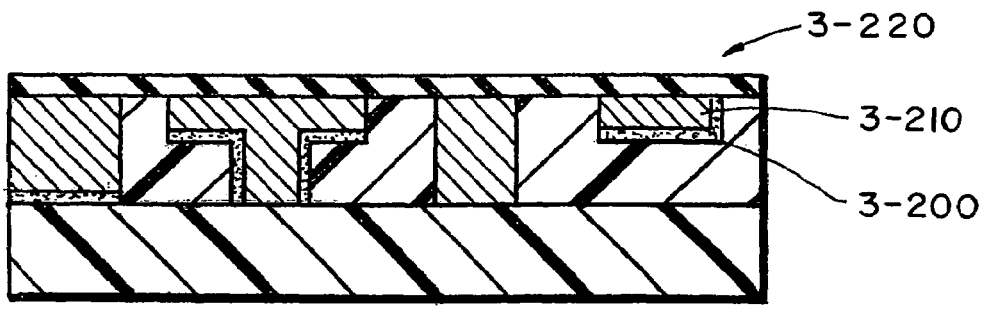

The final dual damascene structure in the interlayer dielectric is then coated with a liner, 3-200, and metalized 3-210. The liner and metal are polished to the surface of the interlayer dielectric. Then a cap layer, 3-220, is put down selectively over the metal lines or, as shown FIG. 3e, is put down in a blanket film. This structure is then ready for another level build which repeats the steps detailed above.

In order to reduce the process complexity and facilitate multilevel imprint lithographic patterning, the mold or template must be fabricated with the appropriate multilayered structure. As shown in FIGS. 2 and 3, the mold would then be used to replicate its relief structure on the surface of a substrate in a moldable material. As shown above, the replica could be used in either of the two embodiments.

In the first embodiment, the material in which the relief is generated would be used as the interlayer dielectric. In the second embodiment, the relief structure in the imprinted material would be used to reactive ion etch the relief into an underlying material.

The method of mold fabrication follows advanced phase shift reticle manufacturing techniques and traditional dual damascene masking methodologies. Examples of such methodologies are found in *Proceedings of Advanced Metallization Conference*, Tim Dalton, et al., pps 85-89, MRS (2004), the contents of which are hereby incorporated by reference herein. Two reactive ion etches and two lithography steps would be required to print a multilayered pattern on the surface of the mold substrate using traditional imaging techniques such as electron beam, ion beam (projected or focused), optical pattern generators (photons), scanning probes, or similar techniques. Alternative imaging solutions such as advanced interferometric lithography could also be used to image the multilayered structure onto the surface. Two approaches for the mold fabrication process are depicted in FIG. 4 and FIG. 5. In FIG. 4, a multilayer lithographic scheme is depicted.

As noted above, there are two types of photoresists: positive and negative. For positive resists, the resist is exposed to, for example, UV light, wherever the underlying material is to be removed. In these resists, exposure to a source of radiation, or some other activating means such as UV light, changes the chemistry of the resist so that it becomes more soluble in a developer. The exposed resist is then washed away by the developer solution. The mask in this case contains an exact replica of the pattern which remains on the substrate.

In a negative resist, the exposure to the activating means, such as UV light causes the negative resist to become polymerized, strengthened and essentially insoluble in the developer solution. Thus, the negative resist reamins on the surface wherever is is exposed. The system is analogous to a photographic negative which contain substantially transparent and substantially opaque areas. In this negative system, the areas under the transparent areas are polymerized and the areas under the opaque areas are not and wash away with the application of the developer solution. The negative image of the image of the mask is transferred to the resist. The present invention utilizes the "negative" resist.

The negative line level and negative via level pattern in the mold generate a negative of the dualk damascene structure. Thus the imprinted relief equates to the dual damascene structure.

Figure 4A:
FIG. 4 depicts cross sectional views of articles resulting from the Mold Fabrication Process for Dual Damascene Relief Structure of the present invention.
Figure 4B:
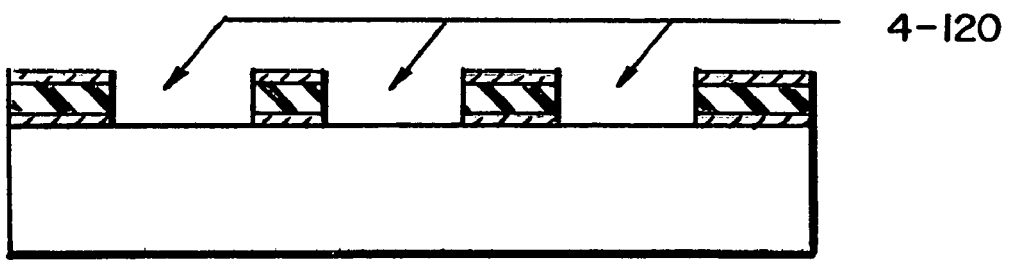
Figure 4C:
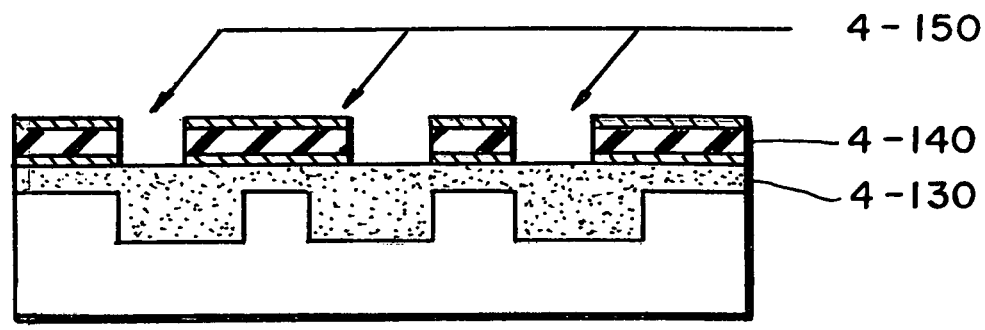
Figure 4D:
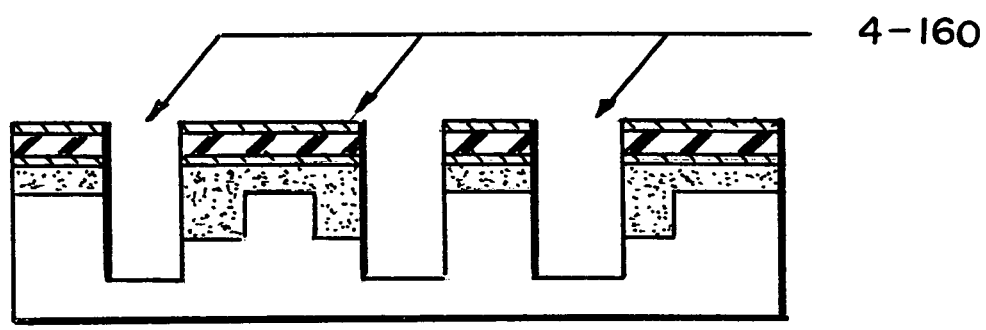
Figure 4E:
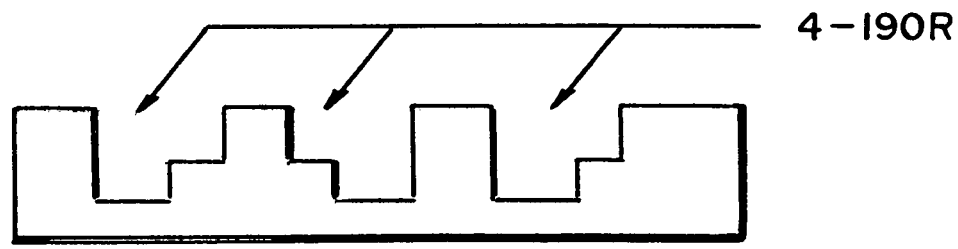
Figure 4F:
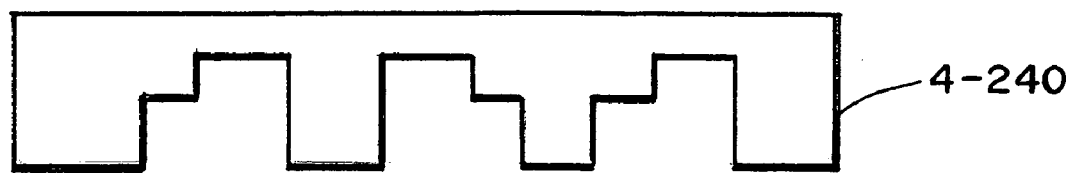

In FIG. 4a, a mold substrate, 4-100, is coated with a resist material, 4-110. This resist material is patterned with a negative via-level pattern as depicted in FIG. 4b. This pattern is then etched into the substrate leaving a negative via-level topography transferred into the substrate. A planarizing layer, 4-130, is used to coat over the substrate. A resist, 4-140, is then coated over this layer and patterned with a negative line-level pattern, 4-150, as shown in FIG. 4c. This negative line pattern is then used to etch into the substrate to generate a negative line pattern, 4-160, in the mold substrate as in FIG. 4d. The layers are then removed to leave the desired negative dual damascene relief topography, 4-190R. This topography is then used as a mold, 4-240, shown in FIG. 4f. As indicated in FIG. 4f, this can then be used as a mold, 4-240, in the imprint patterning steps for the patterning steps in forming the articles depicted in FIG. 2 (2-240) and FIG. 3 (3-240). It should be noted that the order of the patterning can be either via-first or line-first.

A second embodiment of the mold fabrication process of the present invention utilizes a trilayered hardmask scheme. The particular number of hardmask in this scheme is representative and does not limit the approach to three layers.

Figure 5A:
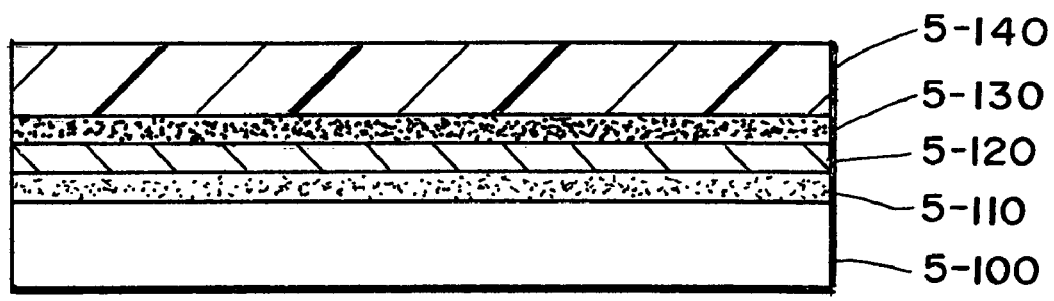
FIG. 5 depicts cross sectional views of articles resulting from the Mold Fabrication Process for Dual Damascene Relief Structure using a Multilayer Hardmask Stack.

In FIG. 5a, a mold substrate, 5-100, is coated with a trilayer hardmask stack comprising three distinct layers, 5-110, 5-120, and 5-130. The bottom hardmask 5-110 serves as an etch-stop layer as depicted in FIG. 5. The middle hardmask 5-120 is used to print the negative line-level pattern. The top layer 5-130 is used to pattern the negative via level pattern.

Figure 5B:
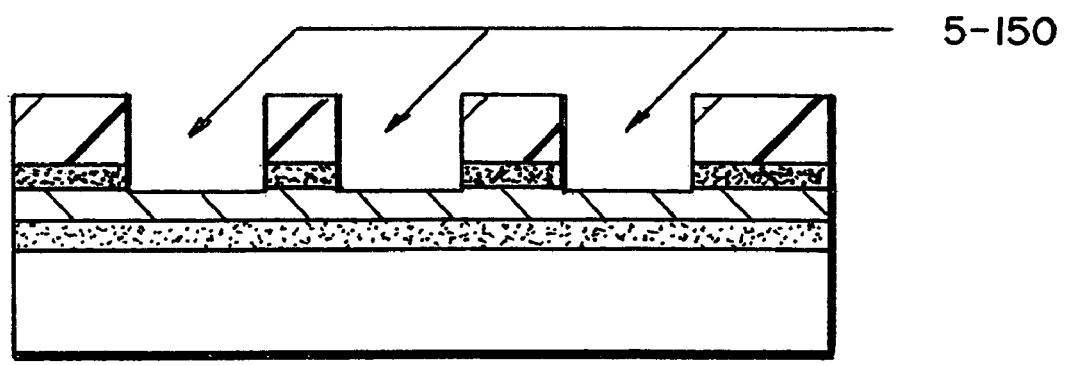
Figure 5C:
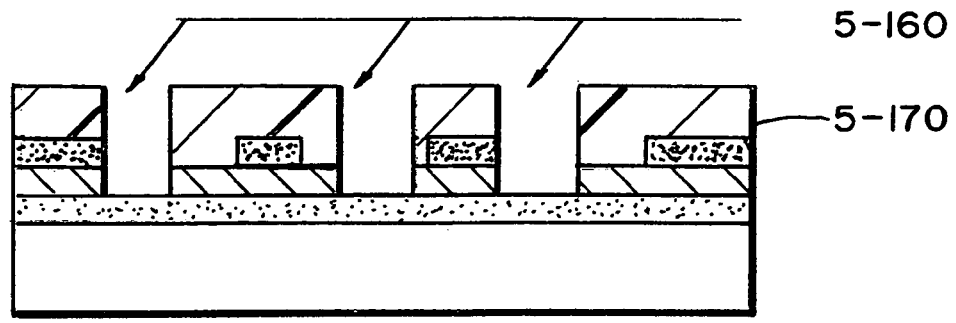
Figure 5D:
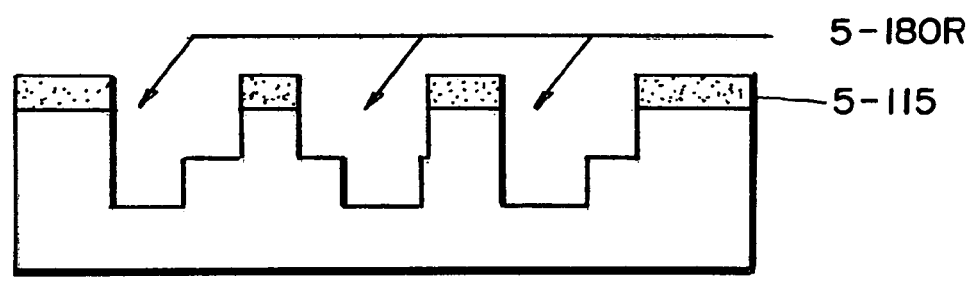
Figure 5E:
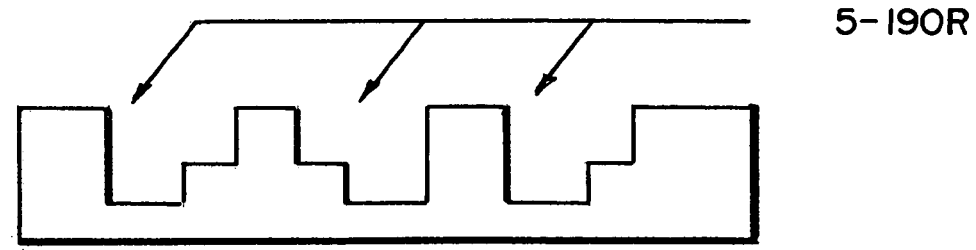
Figure 5F:
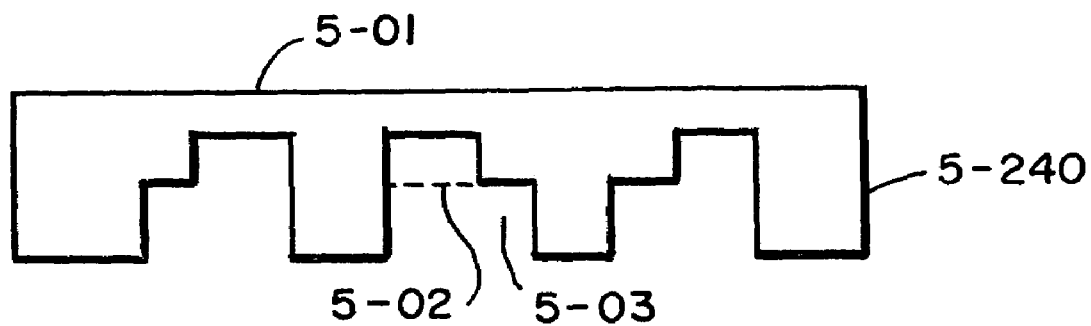
Figure 5G:
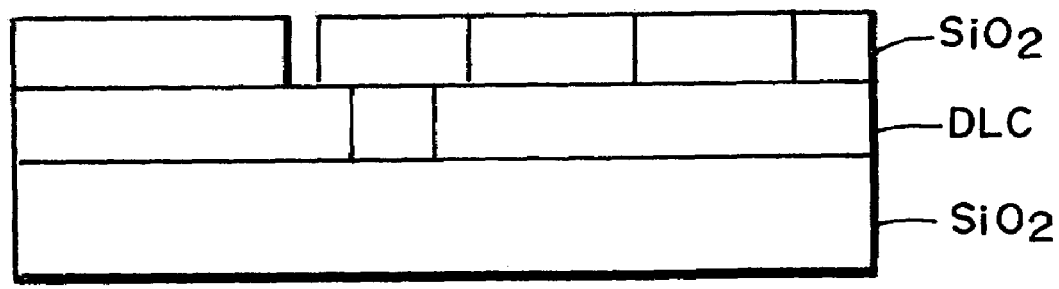

Upon this stack, a resist, 5-140 is coated (FIG. 5a). As shown in FIG. 5b, a negative via-level pattern is generated in the resist. This negative via-level pattern is transferred into the top hardmask layer, 5-130, to generate a topographical pattern, 5-150. A resist, 5-170, is coated over topography of the 5-130 hardmask and patterned with a negative line-level pattern and then reactive ion etched through the hardmask stack (i.e., 5-110, 5-120, 5-130) and into the substrate, 5-100, to leave the negative line-level pattern, 5-160, as shown in FIG. 5c. In FIG. 5d, the transfer of the negative line-level pattern, 5-160, and the negative via-level is transferred through the two hardmasks (5-120, 5-130) to generate the relief of a dual damascene-like structure, 5-180R, that retains the patterned hardmask 5-115 which is used to protect the top surface of the mold (FIG. 5d.). The hardmask 5-115 is removed to leave the appropriate negative dual damascene relief structure, 5-190R (FIG. 5e). As indicated in FIG. 5f, this can then be used as a mold, 5-240, in the imprint patterning steps for the patterning steps of FIGS. 2 and 3 (2-240, 3-240). In FIG. 5f, element 5-01 depicts the back of the structure to be formed, the negative line is 5-02 and the negative via is depicted at 5-03.

While the invention is described in terms of a via exposure methodology first, as depicted in FIGS. 4 and 5, a line first exposure methodology is equally practicable by those skilled in the art.

The mold described above is fabricated from a variety of inorganic and organic materials. Several examples of are silicon, silicon dioxide, silicon nitride, diamond-like carbon, silsesquioxane, alumina, indium tin oxide, gallium arsenide. Further, polymers such as poly(methylmethacrylate), polystryrene, polycarbonate, polytetrafluroethane, or any other appropriate material by itself, a composite material or a layered material that meets the mechanical, optical and thermal requirements. Each level (line level and via level) of the mold may be composed of different materials listed above allowing ease of fabrication.

The modulus should be greater than 10 MPa and have a strength greater than 10 MPa. The thickness and size of the mold are dictated by the application. A wafer scale mold would necessarily be larger in diameter. For photocuring, either the substrate or the mold must be transparent to the wavelength to which the photocurable material is sensitive.

The advantage of the imprint lithography process of the present invention is the minimization of the process steps required to fabricate the multilayered dual damascene structure and elimination of hardmask materials and associated equipment. In conventional processing, a lithography step is used to define one layer at a time. In this process, a single process creates a multilayered structure. The hardmask deposition process, the two conventional lithography steps, and the two reactive ion etchs of the prior art are replaced with a single imprint lithography step followed by one short etch that allows good electrical contact to the underlying conductive pattern once metallization is complete. The process of the present invention eliminates alignment deviation that varies from lot to lot and chip to chip. The number of alignment steps and their metrology are decreased by 50%.

The imprint lithography process of the present invention achieves substantially improved results over the prior art by creating the nonconventional multilayer mold such that two layers are patterned in a single step. It is especially beneficial as it is applied to dual damascene structures where via placement is critical.

In the first embodiment, shown in FIG. 2, the imprinted material is a suitable dielectric. Therefore, only a short and less damaging etch is required to remove any residual material in the via. In the second embodiment, shown in FIG. 3, the pattern is transferred using reactive ion etching into the underlying interlayer dielectric material.

An example of the relief structure that can be generated by imprint lithography is shown in FIG. 5. This example is a relief image of a dual damascene imprint mold itself. Hence, this relief could be used as the mold for a dual damascene imprint.

The imprintable material may be conveniently applied to the surface of the resist using a "spin coating" process that produces a uniform layer of imprintable material on the surface to which is it applied.

For the first preferred embodiment, the imprintable material must be photosensitive and ideally have a low viscosity. This feature is discussed in greater detail in Colburn, M., *Step And Flash Imprint Lithography; A Low-Pressure, Room-Temperature Nanoimprint Lithography*, Ph.D. Thesis, The University of Texas at Austin 2001, referred to hereinafter as "Colburn" and the contents of which are hereby incorporated by reference herein.

However, the photosensitive imprintable material must also act as an interlayer dielectric. Consequently, it must exhibit sufficient thermal stability, dielectric breakdown, low dielectric loss, long-term stability of dielectric properties under stress. These properties may not exist in the material as imprinted, but may be imparted in the material by a post-imprint thermal treatment, a post-imprint plasma treatment, a post-imprint chemical treatment, or combination of these treatments.

The multilevel structure of the present invention is a curable material formulated using an organic polymeric resin such as polymethylmethacrylate, polyacrylates, polyepoxides, functionalized dimethylsiloxanes, alkylsilanes, functionalized methsilsesquioxanes, hydrosilsesquioxanes, polyurethanes, polycyanoacrylates, polystyrene polyvinyls, polyvinylethers, ketene acetals, cyclohexyl epoxides, a polymeric network crosslinked by a diene-dieneophile reaction comprising a Diels-Alder reaction and polyimide.

The curable material may also be formulated using an organosilicate resin such as polyhedral silsesquioxanes, silsesquioxanes, dimethylsiloxanes, polycarbosilanes.

Further, the multilevel structure the curable material is formulated using conductive polymers selected from the groups consisting of poly(thiophene) and polyanaline.

The curable material contains any combination of initiator, resin(s), monomer(s), coupling/adhesion agent(s), release agent(s), and crosslinking agent. In each case the curable material contains a multifunctional monomer or oligmer that serves as a crosslinking agent. It is important to note that the amount of each constituent contained in the various compositions embodied within the scope of the present invention may vary because the relative proportions of each constituent will be a function of the desired properties of the final product produced and will be within the scope of the skilled artisan.

The low molecular weight materials materials noted are: methyl acrylate, methyl methacrylate, epoxides, vinyls, silyl vinyl ethers, ketenes, or functionalized versions of polyhedral silsesquioxanes, silsesquioxanes, dimethylsiloxanes, polycarbosilanes, and combinations thereof.

The coupling agents used are designed to form covalent bonds between the substrate and the cured material. Suitable coupling agents are: acrylate functionalized silanes, 3-acryloxypropyltrimethoxysilane, alkoxysilanes functionalized methacrylates, polyacrylates, polyepoxides, functionalized dimethylsiloxanes, alkylsilanes, functionalized methsilsesquioxanes, hydrosilsesquioxanes, polyurethanes, polycyanoacrylates, polystyrene polyvinyls, polyvinylethers, ketene acetals, a polymeric network crosslinked by a diene-dieneophile reaction comprising a Diels-Alder reaction and polyimide.

The curable imprint material of the present invention contains release agents designed to minimize adhesion to a multilevel mold or template. Typical release agents are: tridecafluoro acrylate, functionalized methacrylates, acrylates, epoxides, cyclohexylepoxides, functionalized dimethylsiloxanes, alkylsilanes, functionalized methsilsesquioxanes, hydrosilsesquioxanes, polyurethanes, polycyanoacrylates, polystyrene polyvinyls, polyvinylethers, ketene acetals, a polymeric network crosslinked by a diene-dieneophile reaction comprising a Diels-Alder reaction.

Suitable cross-linking agent are: bis functional methacrylates, acrylates, epoxides, functionalized dimethylsiloxanes, alkylsilanes, functionalized methsilsesquioxanes, hydrosilsesquioxanes, polyurethanes, polycyanoacrylates, polystyrene polyvinyls, polyvinylethers, ketene acetals, a polymeric network crosslinked by a diene-dieneophile reaction comprising a Diels-Alder reaction.

The multilevel structure of the present invention may contain selectively decomposable and removable components in order to generate a porous structure said components forming a material being a thermally labil material that thermally degrades above 200° C. selectively to resin. The used may be: polymethylmethacrylate, polystyrene and polypropylene glycol.

The initiators consist of typical free radical generators such as benzophenone free radical generator, iodonium salts, a photoacid generator, AIBN thermal free radical generator, a thermal acid generator, and any combination of the above mentioned compounds to initiate the curing process.

The acid generator used in accordance with the present invention is preferably an acid generator compound that liberates acid upon photo treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 and 5,939,236. The disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are also described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (crosslinking) temperature of the composition may be reduced by application of appropriate radiation to induce acid generation which in turn catalyzes the crosslinking reaction. Even if a radiation-sensitive acid generator is used, it is preferred to thermally treat the composition to accelerate the crosslinking process (e.g., for wafers in a production line.)

Examples of photosensitive imprintable materials that meet the requirements set forth above include, but are not limited to, functionalized dimethylsiloxanes, alkylsilanes, functionalized methsilsesquioxanes, hydrosilsesquioxanes, urethanes, polyimides, parylene, polytetrafluoroethane, etc. The reactive functionalities of the photosensitive imprintable material, include, but are not limited to vinyl ethers, ketene acetals, diene-dieneophiles, methacrylates, acrylates, epoxides Sacrificial components of the curable dielectric material may be removed to generate a porous film. These sacrificial components can be tailored by composites as described in *Supramolecular Approaches to Nanoscale Dielectric Foams for Advanced Microelectronic Devices*, Craig J. Hawker, James L. Hedrick, Robert D. Miller and Willi Volksen, MIRS Bulletin, April 2000, the contents of which are hereby incorporated by reference herein.

For the second embodiment, the imprintable material must be photosensitive and ideally have a low viscosity. (See also: Coburn supra) It must provide sufficient etch selectivity to pattern the underlying interlayer dielectric material.

Examples of materials that meet this requirement include but are not limited to vinyl ethers, ketene acetals, diene-dieneophiles, methacrylates, acrylates, epoxides, functionalized dimethylsiloxanes, alkylsilanes, functionalized methsilsesquioxanes, hydrosilsesquioxanes, urethanes, cyanoacrylates or other reactive monomeric or oligomeric materials.

The mechanical and adhesive properties are also important to an imprinted dielectric used in accordance with the present invention. Ideally, the material must be mechanically stable enough to withstand subsequent processing such as chemical-mechanical polishing (CMP), or wire bonding to name a few. The material must adhere to the various interfaces. Preferably, the imprintable material is tailored and suitable to accommodate interfacial bonding.

For instance, in the second embodiment, if the imprinted material is patterned over a $SiO_2$ layer, and the imprinted material was an acrylate, an acrylate functionalized silane such as 3-acryloxypropyl-trimethoxysilane would react with the SiO$_2$ as well as with the acrylate backbone of the imprinted material. Other means, such as utilizing a second "non photosensitive" thermally initiated reaction such as a condensation to improve adhesion or mechanical properties may also be beneficial if dersired.

In order to make the imprinted material mechanically stable, some crosslinking agent such as a multifunctional monomer may need to be added to the imprint solution. Additionally, low surface energy components such as fluorinated alkyl-acrylates improve process performance by minimizing the separation force when the mold is removed from the imprinted surface. The mold may also be treated with a low surface energy treatment such as fluorinated alkyl-silanes such as:

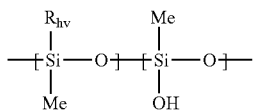

And the reaction for forming such composition is:

The imprint mold itself must be attached to a mechanical structure that enables the imprint to be performed. Many systems exist to perform this task. Such systems are disclosed in Johnson, S; *Selectively Compliant Orientation Stages For Imprint Lithography*, MS Thesis, The University of Texas at Austin, 1999; Chou, S. Y., P. R. Krauss, and P. J. Renstrom. *J. Vac. Sci. Tech. B,* 14(6) (1996) 4129; H. Tan, A. Gilbertson, and S. Y. Chou, *Roller Nanoimprint Lithography,*" *J. VST B*. 16(6), 3926-8, (1998); Colburn, M., et al.; *Proc. SPIE* 1999, Santa Clara, Calif., 3676(I), p. 379; *Nanoimprint Lithography Equipment* from www.obducat.com, the contents of which are hereby incorporated by reference herein.

However, precision flexure-based stages offer repeatable means of performing the motion while minimizing particle generation and shear action. The use of a flexure stage in conjunction with a dual damascene mold offers a combination ideally suited for high resolution patterning while minimizing particles and maximizing reproducibility.

Ideally, the center of rotation is at the surface of the mold. However, it may be beneficial to have the center of rotation be off-set from the central point of mold surface but remain in the plane of the mold surface. Using this arrangement allows for the imprint fluid to be expelled from the gap between the mold and the substrate with less force. Support for this is found in Nguyen, C., *Asymmetric Fluid-Structure Dynamics In Nanoscale Imprint Lithography*, MS Thesis, The University of Texas at Austin 2001, which is incorporated by reference herein.

Dispensing the imprintable material in droplets or a micro-pattern may improve imprint uniformity and decrease the force required to imprint the material. For example, the system used to dispense the curable material can dispense same in microliter quantities, smaller droplets or a series of individual droplets. The material should be dispensed in a defined pattern such as a continuous pattern or a "W" pattern. If using a final casting layer in the process, spin coating is also applicable.

Gap control is of particular interest when performing a dual damascene imprint since the via pattern is less dense than the line-level pattern. Since via level pattern density is low, poor gap control can lead to enormous localized pressure genera-tion since pressure is related to inverse of the gap distance cubed. (See: Colburn, supra.) Consequently, when the imprint is performed a z-direction gap sensing system is desirable.

Preferably, a nondestructive system such as capacitance sensors, pneumatic sensors, piezo sensors, spectral reflectometers, single and multiwavelength interferometers, or ellipsometers may be used for gap control. Overlay of a dual damascene mold may be performed by using embedded alignment marks that are recessed into the mold. Examples of such systems are disclosed in U.S. Pat. No. 6,696,220, and in articles by E. E. Moon, et al. *JVST B* 14 (6) November/December 1996 and Moon, et al. *JVST B* 21 (6) November/December 2003, the contents of which are hereby incorporated by reference herein.

The surface of the mold can be treated with a low surface energy component. The low surface energy component is a fluorinated self assembly monolayer comprising a fluorinated alkyl halosilane, fluorinated alkyl alkoxysilane, fluorinated alkyl acetoxy silane and tridecafluorooctyltrichlorosilane.

Suitable fluorinated compounds which can be used have the general formula:

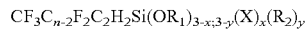

Wherein X is halogen, Cl, Br; $R_1$ is alkyl $C_1$ to $C_8$; $R_2$ is alkyl, methyl;

x=0 to 3; y=0 to 2 and n is greater than or equal to 2; and x+y+(3−x−y)=3

Specific examples of the fluorinated compounds which can be used as a low surface energy component are: tridecafluorooctyl trichloro silane; tridecafluorooctyl dimethyl chloro silane; tridecafluorooctyl methyl dichloro silane; tridecafluorooctyl trimethoxy silane; tridecafluorooctyl trimethoxy silane; tridecafluorooctyl diethoxy methyl silane; nonafluorohexyl trichloro silane; nonafluorohexyl dimethyl chloro silane; nonafluorohexyl methyl dichloro silane; nonafluorohexyl trimethoxy silane; nonafluorohexyl trimethoxy silane; nonafluorohexyl diethoxy methyl silane.

Figure 6:
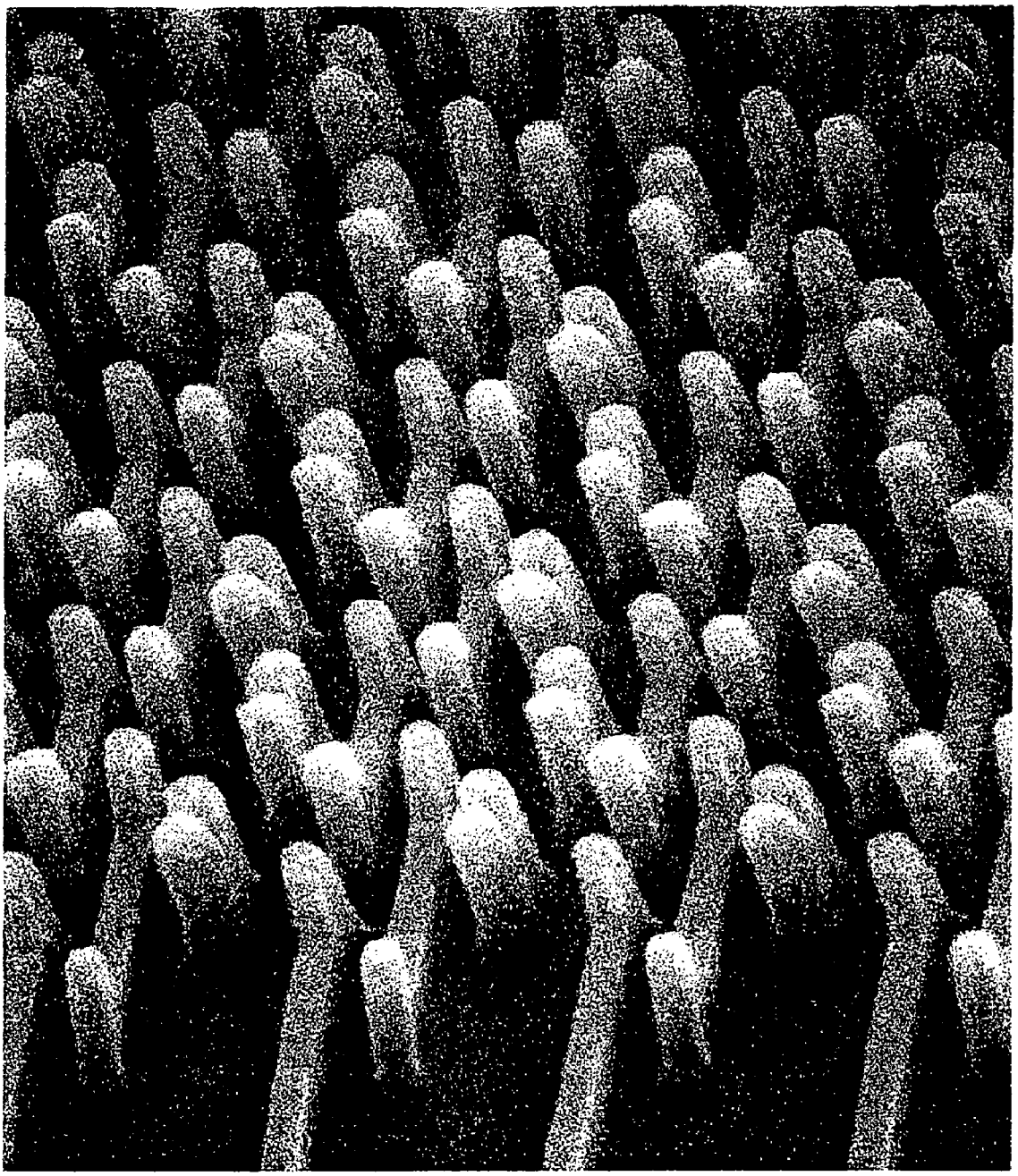
FIG. 6 is a micrograph of a Relief structure of a dual damascene imprint mold.

FIG. 6 is an image of a dual damascene relief structure of an imprint mold. This particular mold was fabricated by replication of an actual dual damascene structure in accordance with the present invention. The highest level shown is the via level; the second level from the top is the line level. A unique feature of the dual damascene imprint mold is the low pattern density of the highest level which represents the mold that will be closest to the substrate. This serves to minimize that force require to imprint the mold into the imprint resin.

Figure 7:
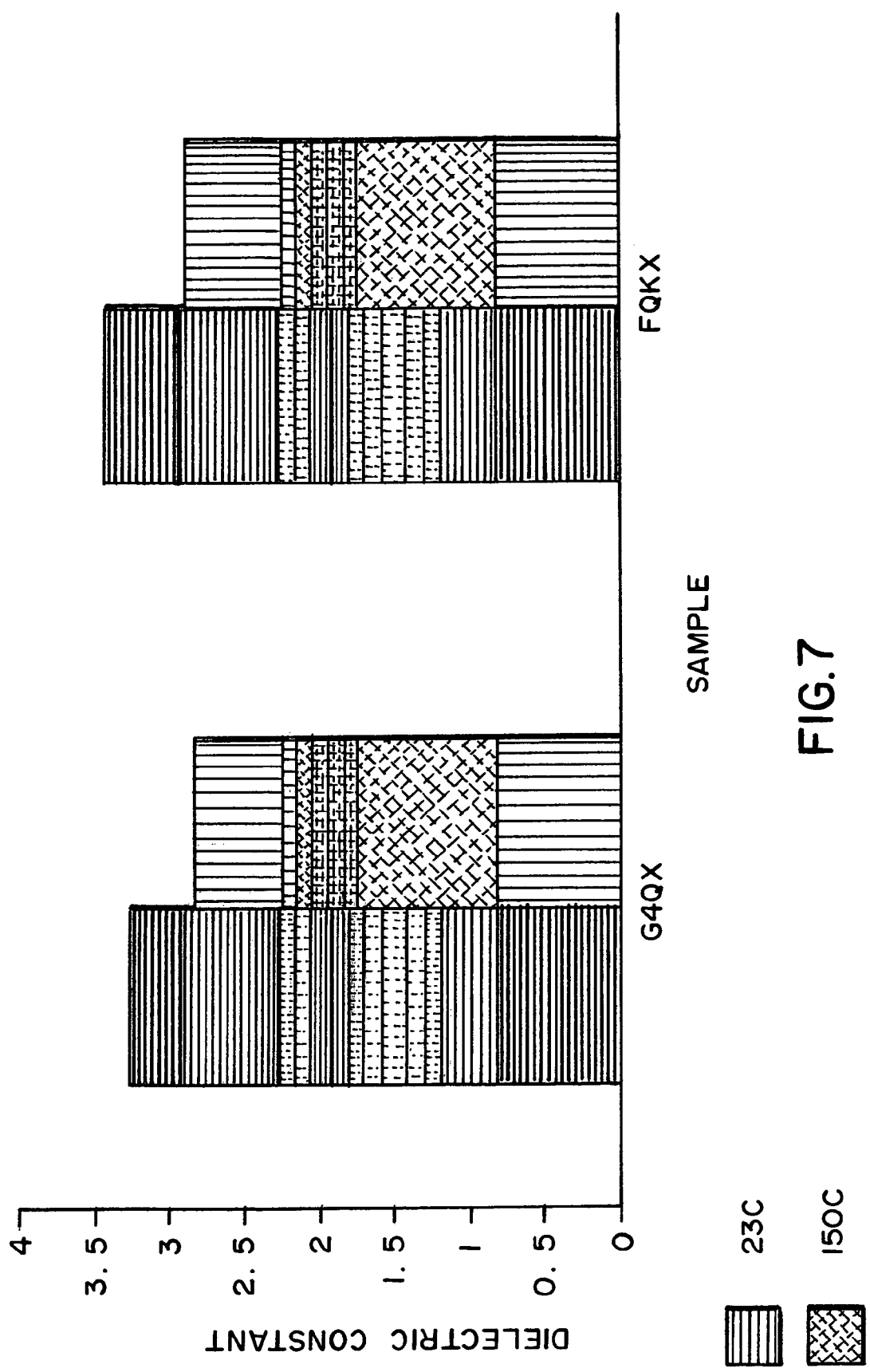
FIG. 7 is a chart disclosing the Dielectric Constant of two photocrosslinkable dielectric films.

FIG. 7 represents the dielectric constant of two photo-crosslinkable dielectric materials that have been thermally cured after photo-curing. The measurement was performed in a Metal-Insulator-Semiconductor structure where the Metal was aluminum, the insulator is the dielectric material, and the semiconductor is a silicon wafer.

Figure 8A:
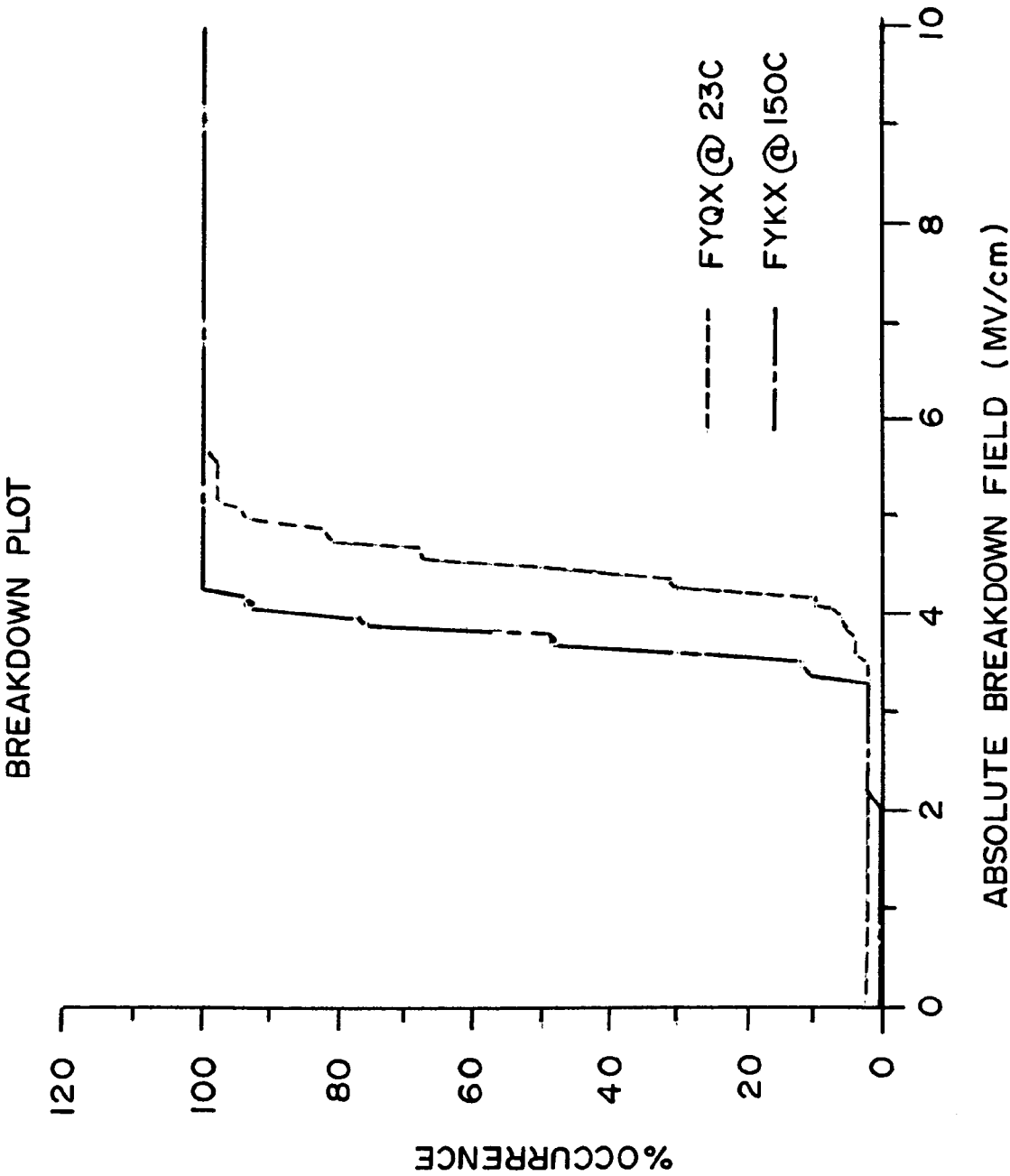
FIG. 8 is a graph depicting Dielectric Breakdown and Leakage as a function of Electric Field.
Figure 8B:
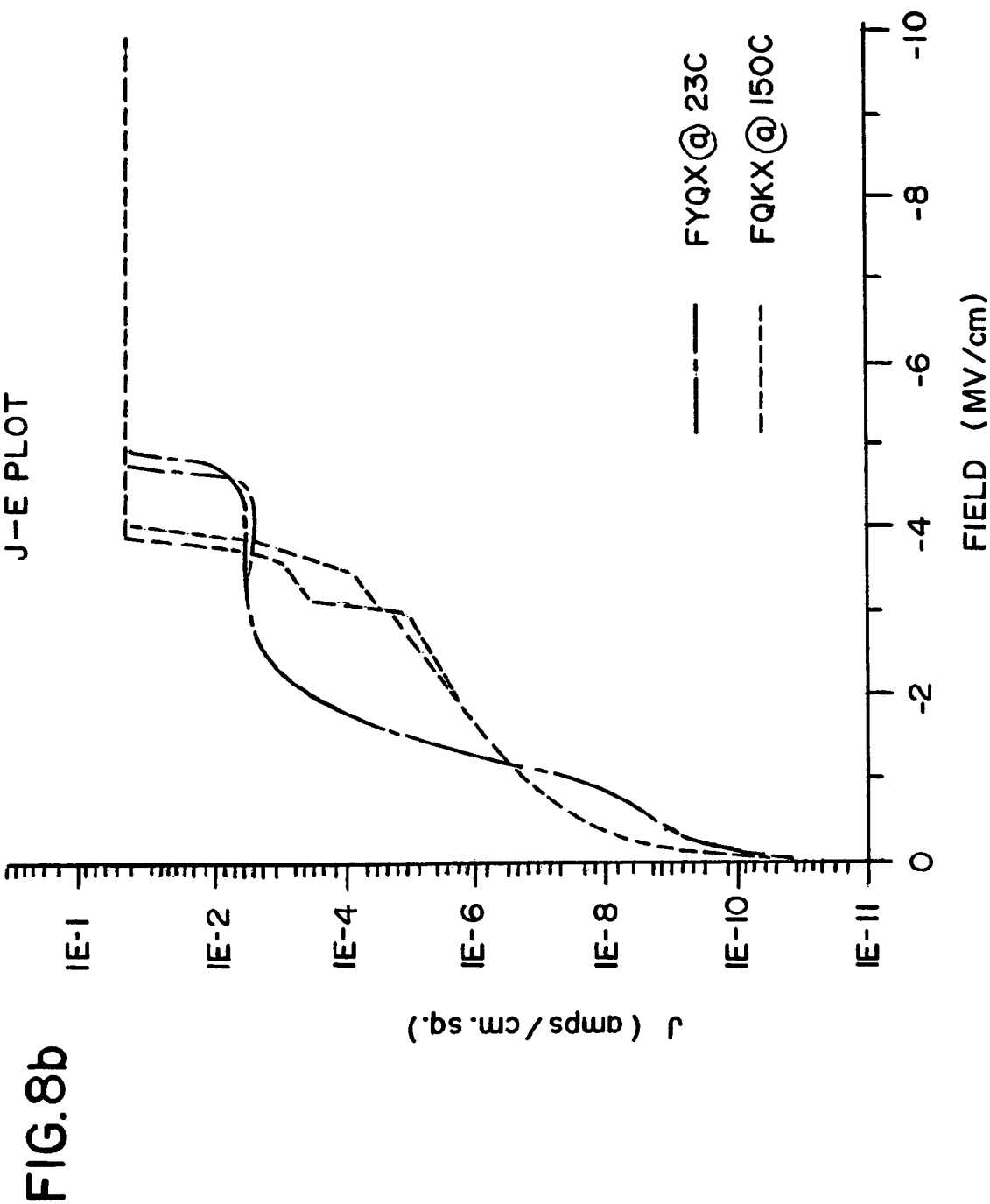

FIG. 8(*a*). shows the breakdown (leakage current greater than 1e-5 A/cm2) as a function of tested MIS structures. This isolates the defect density or material quality. A breakdown field of 4 MV/cm is similar to porous dielectrics currently available commercially available. FIG. 8(*b*) discloses the leakage current (A/cm2) for representative measurement site versus field strength (MV/cm). Breakdown is set at Field Strength at which leakage current greater than 1e-5 A/cm2. Leakage current is defined as current flowing between the insulator in the MIS structure during the test.

Thus while there have been shown and described and pointed out fundamental novel features of the invention as applied to currently preferred embodiments thereof, it will be understood that various omissions, substitutions and changes in the form and details as to the communication system of the present invention and methods encompassed therewith, may be made by those skilled in the art without departing from the spirit of the invention. In addition, it is to be understood that the drawings are provided for informational purposes. It is the intention therefore to be limited only as indicated by the scope of the claims appended herewith.

What we claim and desire to protect by Letters Patent is:

1. An imprint lithography mold comprising a multilevel mold containing a negative relief image of a dual damascene structure having:
 a substrate coated with a trilayer hardmask stack;
 said trilayer hardmask stack having a plurality of layers including:
  a bottom hardmask layer, having a composition suitable to be an etchstop layer,
  said bottom layer being in contact with said substrate;
  a middle hardmask layer having a composition suitable to print a negative line-level pattern, said line level pattern forming the basis for the horizontal line levels existing within said mold, said middle layer being in contact with an exposed surface of said bottom etchstop layer;
  a top layer having a composition suitable to print a negative via level pattern and having an upper and a lower surface, said lower surface of said top layer being in contact with an exposed surface of said middle layer;
   said upper surface of said top layer of said trilayer hardmask stack having a removable negative via level pattern which forms a topographical pattern, said pattern forming the basis for the multilevel vertical depth trenches existing within said mold;
   a resist coating on said upper surface of said top layer of said hardmask stack, said resist coating being patterned with a negative line level pattern;
  said mold containing multilevel mold elements through said trilayer hardmask stack and said substrate aligned with and corresponding to said negative line level pattern and with and to said negative via level pattern resulting in a negative of a dual damascene-like structure.

2. The multilevel mold defined in claim 1, wherein said mold substrate is a material selected from the group consisting of quartz, silicon, pyrex, Indium Tin Oxide, GaAs and InP.

3. The mold defined in claim 1 in which a surface of said mold is treated with a low surface energy component.

4. The mold defined in claim 3 wherein said low surface energy component is a fluorinated self assembly monolayer comprising a fluorinated alkyl halosilane, fluorinated alkyl alkoxysilane, fluorinated alkyl acetoxy silane and tridecafluorooctyltrichlorosilane.

5. The mold defined in claim 1 wherein alignment marks are incorporated into a structure of said mold, wherein said alignment marks comprise diffractive grating, moire fringe, chirped, verniers and box-in-box patterns.

6. The mold defined in claim 1 wherein said mold comprises a plurality of materials and wherein one or more of said materials is patterned with alignment marks.

7. The mold defined in claim 1 which incorporates recessed regions used to confine displaced material.

8. The mold defined in claim 7 which incorporates recessed regions on the periphery of the imprint pattern.

9. The mold defined in claim 8 which incorporates a recess region that is pre-measured in order to provide a reference surface for substrate-mold gap control.

10. The mold defined in claim 1 which is a second-generation mold that is fabricated by embossing a master mold into a curable material that is coated on a second-generation mold.

* * * * *